(12) United States Patent
Johansen et al.

(10) Patent No.: US 6,538,475 B1
(45) Date of Patent: Mar. 25, 2003

(54) PHASE DETECTOR

(75) Inventors: Henrik Ingvart Johansen, Ballerup (DK); Henning Lysdal, Roskilde (DK); Benny Christensen, Frederikssund (DK)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/525,459

(22) Filed: Mar. 15, 2000

(51) Int. Cl.⁷ .............................................. H03D 13/00
(52) U.S. Cl. .............................................. 327/12; 327/9
(58) Field of Search .............................. 327/2, 3, 7, 12, 327/18, 147, 156, 141

(56) References Cited

U.S. PATENT DOCUMENTS

| | | |
|---|---|---|
| 4,819,251 A | 4/1989 | Nelson ........................ 375/373 |
| 5,592,125 A | 1/1997 | Williams |
| 5,594,762 A | 1/1997 | Joo et al. |
| 5,719,908 A | 2/1998 | Greeff et al. |
| 6,181,758 B1 * | 1/2001 | Trimmel et al. ............ 327/147 |

* cited by examiner

Primary Examiner—Kenneth B. Wells
Assistant Examiner—Cassandra Cox
(74) Attorney, Agent, or Firm—Blakely, Sokoloff, Taylor & Zafman LLP

(57) ABSTRACT

A phase detector and corresponding method. The phase detector detects a transition of a first signal and generates an output signal having a first value if a transition of a second signal occurs before the transition of the first signal and having a second value if the transition of the second signal occurs after the transition of the first signal. The output signal is maintained at the generated value until another transition of the first signal is detected. A strobe signal may be used to strobe the output signal.

10 Claims, 8 Drawing Sheets

PHASE DETECTOR

FIELD OF THE INVENTION

The present invention relates to a phase detector and utilization of the phase detector for synchronization of a digital data signal with a clock signal, e.g. in clock and data recovery circuits.

BACKGROUND OF THE INVENTION

Upon transmission of digital data at a high data rate, e.g. via an optical transmission line, it is typically required to synchronise the transmitted data bits with a clock signal. Typically the clock signal is generated from the received data signal in a clock and data recovery circuit. Noise tolerance is an essential feature of clock and data recovery circuits.

The ITU-T has specified jitter parameters that are determined in the frequency domain. Jitter tolerance of receiving equipment is defined as the sinusoidal peak-to-peak phase modulation which causes a 1 dB optical penalty.

For example, when characterising a clock and data recovery component, white noise is added to the input signal. By varying the signal-to-noise ratio, an input sensitivity curve of the clock and data recovery component is obtained. Then, the signal-to-noise ratio is set to e.g. a bit error rate of $10^{-9}$, the input signal level is increased by 2 dB (electrical), and the peak-to-peak jitter amplitude that recovers the $10^{-9}$ bit error rate is determined. In known clock and data recovery circuits, the determined values will depend on the processed data pattern and its transition density.

The jitter transfer function is defined as the ratio of jitter at the output relative to jitter applied to the input versus frequency.

The timing characteristics of a received data signal and a clock signal depend on circuit component characteristics, circuit temperature, etc. Therefore, in the field of high speed data communication, it is not a straight forward task to design an electronic circuit providing appropriate synchronisation between the received data signal and a corresponding clock signal so that the above-mentioned sampling of the data signal takes place at the centre of the bit period.

Adjustable circuits are known requiring adjustment of each individual circuit during manufacturing to obtain proper synchronisation of data bits and a clock signal. Such a procedure requires a priori knowledge of the bit frequency and leads to an expensive and complex product.

More recently, electronic circuits have been developed that automatically synchronise a digital data signal with a clock signal. In the known circuits a phase detector compares the phases of the data signal and the clock signal and generates an error output signal that is proportional to the phase difference between the two signals. The error output signal is connected to a controlled oscillator that generates a clock signal and adjusts the actual frequency of the clock signal in response to the error output signal. Thereby, the data signal is synchronised to the clock signal, i.e. the data signal is phase locked to the clock signal, so that the data signal is sampled approximately at the centre of each bit by the clock signal.

SUMMARY OF THE INVENTION

It is an object of the present invention to provide a bang bang phase detector for use in a circuit for synchronising a digital data signal with a clock signal, such as clock and data recovery circuits, etc, and having improved characteristics including jitter tolerance and jitter transfer over known bang bang phase detectors.

It is a further object of the present invention to provide a bang bang phase detector with characteristics that are substantially invariant to the transition density of the phase detector input signals.

It is another object of the present invention to provide a bang bang phase detector that generates an output signal that, when used as a control signal in a phase or frequency locked loop, keeps the gain of the control loop substantially invariant to the transition density of the phase detector input signals.

According to a first aspect of the invention the above and other objects are fulfilled by provision of a phase detector for detection of a phase difference between a first signal and a second signal that comprises a first logic circuit for detection of a data transition of the first signal, and a second logic circuit that generates a logic output signal of a first logic value upon detection of a data transition of the first signal if a transition of the second signal occurs before the transition of the first signal and of a second logic value if the transition of the second signal occurs after the transition of the first signal.

Preferably, the phase detector further comprises a third logic circuit that, in the absence of a data transition of the first signal, maintains the logic output signal at a constant value equal to the value generated at the previous data transition of the first signal.

The logic output signal may be a strobed logic output signal. The strobe signal may be generated from the second signal.

Preferably, the second signal is a clock signal used for sampling of the first signal.

The phase detector may for example be used in a circuit for synchronization of a digital data signal (Din) comprising a controlled oscillator for generation of a clock signal (Ck), and a sampling circuit for sampling the data signal by means of a clock signal (Ck), a phase locked loop including the controlled oscillator for phase locking the internal clock signal (Ck) to the data signal (Din) so that the latter is samples approximately at the center of every bit. The controlled oscillator adjusts the frequency of the clock signal (Ck) in response to the output values of the phase detector.

According to a second aspect of the invention, a phase detection method is provided for detection of a phase difference between a first signal and a second signal, comprising the steps of detection of absence or presence of a data transition of the first signal, and upon detection of a data transition of a first signal, generation of a logic output signal of a first logic value if a transition of the second signal occurs before the transition of the first signal or generation of a second logic value if the transition of the second signal occurs after the transition of the first signal, and, in the absence of a data transition of the first signal, maintaining the logic output signal at the value generated at the previous data transition of the first signal.

The method may further comprise the step of strobing the logic output signal. The strobe signal may be generated from the second signal.

The method may also comprise the step of sampling the first signal with the second signal.

BRIEF DESCRIPTION OF THE DRAWINGS

The invention will be described in greater detail below with reference to the drawings in which.

DETAILED DESCRIPTION OF THE DRAWINGS

The circuits disclosed below are preferably integrated on a single or a few integrated circuits. To support the required high-speed operation of the circuits, logic gates and circuit blocks are preferably implemented as CML logic using bipolar transistors. The preferred process is a 0.4 $\mu$m Bipolar process suitable for digital circuits operating within a frequency range from about 622 MHz to 10 GHz. The NPN transistors provided by this process have $f_T$ values of about 25 GHz. Alternatively, commercially available 0.13–0.25 $\mu$m CMOS processes with sufficiently fast transistors may be capable of being applied in some embodiments of the present invention, e.g. in circuits operating at a low system frequency.

The basic operation of a bang bang phase detector will now be described with reference to FIG. 1 that shows an example of a bang bang phase detector 11. The phase detector 11 compares a clock signal $C_k$ with a data signal $D_{in}$ and provides a binary output signal in response to the phase difference between the two signals. The binary output signal indicates that the data signal has to be delayed in relation to the clock signal, if the clock signal samples the data signal too late in the bit period, and the binary output signal indicates that the clock signal has to be delayed in relation to the data signal, if the clock signal samples the data signal too early in the bit period.

Figure 1:
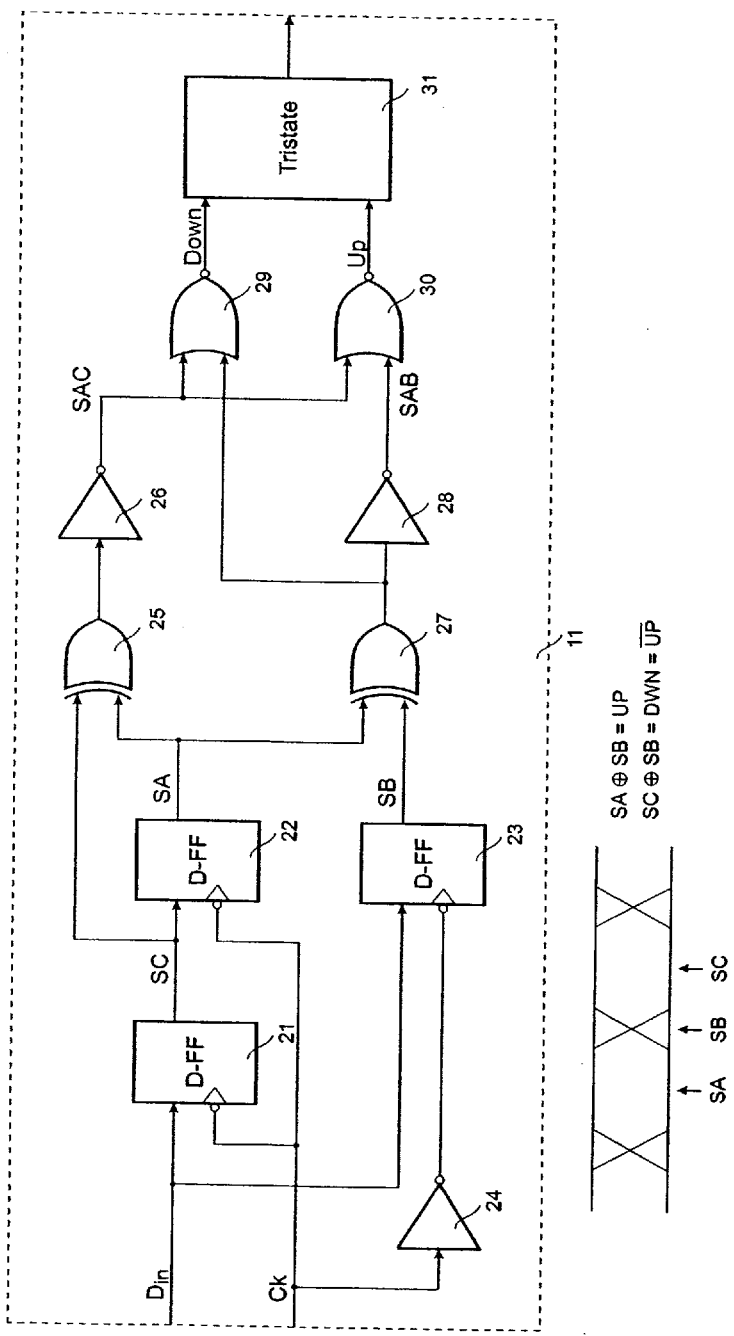
FIG. 1 shows an electronic circuit diagram of a bang bang phase detector.

As shown in FIG. 1, the internal clock signal $C_k$ samples the data signal $D_{in}$ in three flip-flops 21, 22, 23 at three different points in time. The flip-flops 21, 22, 23 sample on a positive going clock edge, flip-flops 21 and 22 contain the present and preceding sampled value of the data signal, respectively. The present value is denoted sample C (SC), and the preceding value is denoted sample A (SA).

The inverter 24 inverts the clock signal so that flip-flop 23 samples the data signal on the negative going edge of the clock signal $C_k$ thereby sampling the data signal approximately halfway between sample A and sample C. This sample is denoted sample B (SB). Thus sample B (SB) is sampled at approximately the time when a data signal transition from the preceding to the present bit period occurs provided that the clock signal has a 50% duty cycle. If this is not the case, the inverter 24 may be replaced by a delay circuit compensating for unequal half-periods of the clock signal.

Thus, three successively sampled values are present at the outputs of the three flip-flops, i.e. SA which was sampled approximately at the centre of the preceding bit period, SB which was sampled about the time of transition from the preceding to the present bit period, and SC which was sampled approximately at the centre of the present bit period. A signal SAC is generated by means of an XOR gate 25 followed by an inverter 26, said signal being logic, "1" if the sampled values SA and SC are identical, and being logic "0" if they are different indicating that there has been a transition from the preceding to the present bit period. Similarly, a signal SAB is generated by means of another XOR gate 27 followed by an inverter 28, said signal being logic "1" if the sampling values SA and SB are identical, and being logic "0" if they are different.

Subsequently, two NOR gates 29 and 30 generate two signals, UP and DOWN. If SAC is logically "1", corresponding to the sampling values SA and SC being identical, both signals UP and DOWN will logically be "0" irrespective of the value of SAB, the sampling value SB being insignificant, since it is impossible, in this situation, to extract information about the position of the sampling time.

When SAC is logic "0" indicating that a transition has occurred from the preceding to the present bit period, the signals UP and DOWN are determined by the signal SAB. The signal DOWN is logic "1" when SAB is "1" i.e. when sampled values SA and SB are identical indicating that the transition from the preceding to the present bit period occurs after the negative going edge of the clock signal. In this case, the clock signal edges occur too early in relation to an optimum sampling time, i.e. the data signal phase is too late in relation to the clock signal. The signal DOWN signals that the data signal phase in relation to the clock signal should be reduced.

When SAB is "0", the signal UP is logical "1", i.e. sampled values SA and SB are different indicating occurrence of a transition from the preceding to the present bit period prior to the negative going edge of the clock signal. In this case, the clock signal edges occur too late in relation to an optimum sampling time, i.e. the data signal phase is too early in relation to the clock signal. The signal UP signals that the data signal phase in relation to the clock signal should be increased.

As shown in FIG. 1, the two signals UP and DOWN may be combined into a single signal in a tri-state circuit or a charge pump 31. When both signals are "0", the output of the circuit 31 is in a high impedance state (tri-state). When the signal UP is logic "1", the output of circuit 31 is logic "1" and when the signal DOWN is logic "1", the output of circuit 31 is logic "0". Consequently with the phase detector shown in FIG. 1, the phase between the data signal and the clock signal $C_k$ is automatically adjusted at each clock cycle so that sample B is sampled at the transition time, and consequently sample C is sampled at the center of the bit period.

Figure 2:
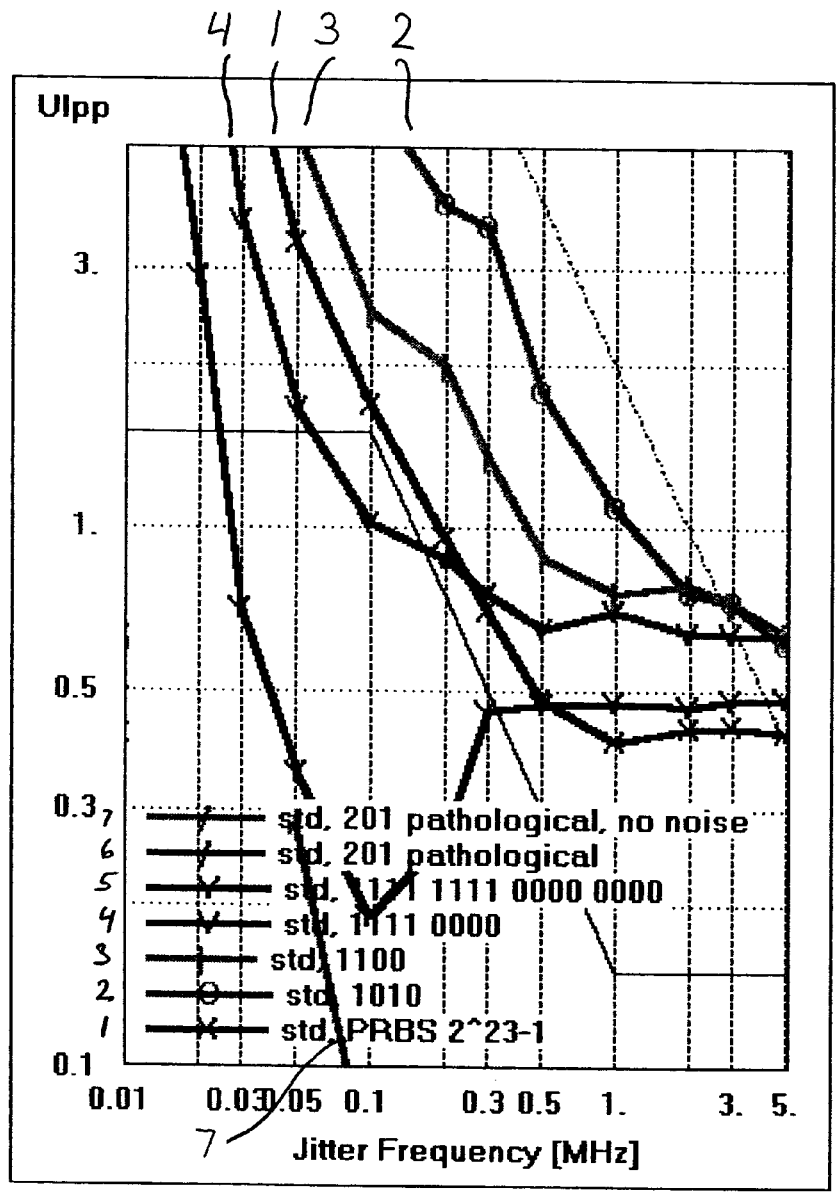
FIG. 2 shows a plot of jitter tolerance of a clock and data recovery circuit with the phase detector shown in FIG. 1.

FIG. 2 shows a plot of measured jitter tolerance of a clock and data recovery circuit incorporating a phase detector of the type shown in FIG. 1. Jitter tolerance is plotted for various data signals. Curve 1 is a plot of jitter tolerance for a pseudo-random bit sequence with a statistical transition density of 0.5. Curve 2 is a corresponding plot for a 101010 . . . bit sequence (transition density equal to 1.0). Curve 3 is a corresponding plot for a 110011001100 . . . bit sequence (transition density equal to 0.5). Curve 4 is a corresponding plot for a 1111000011110000 . . . bit sequence (transition density equal to 0.25). Curve 5 is a corresponding plot for a 1111111100000000 . . . bit sequence (transition density equal to 0.125). Curve 7 is a corresponding plot for a HDTV data signal (transition density equal to 0.05) with no noise, with noise the trace, curve 6, is not obtained. The limits defined in the ITU-T recommendations G.825 and G.958 are also plotted and it is seen that each of the curves exceeds the recommended limits in certain regions of the plot.

Figure 3:
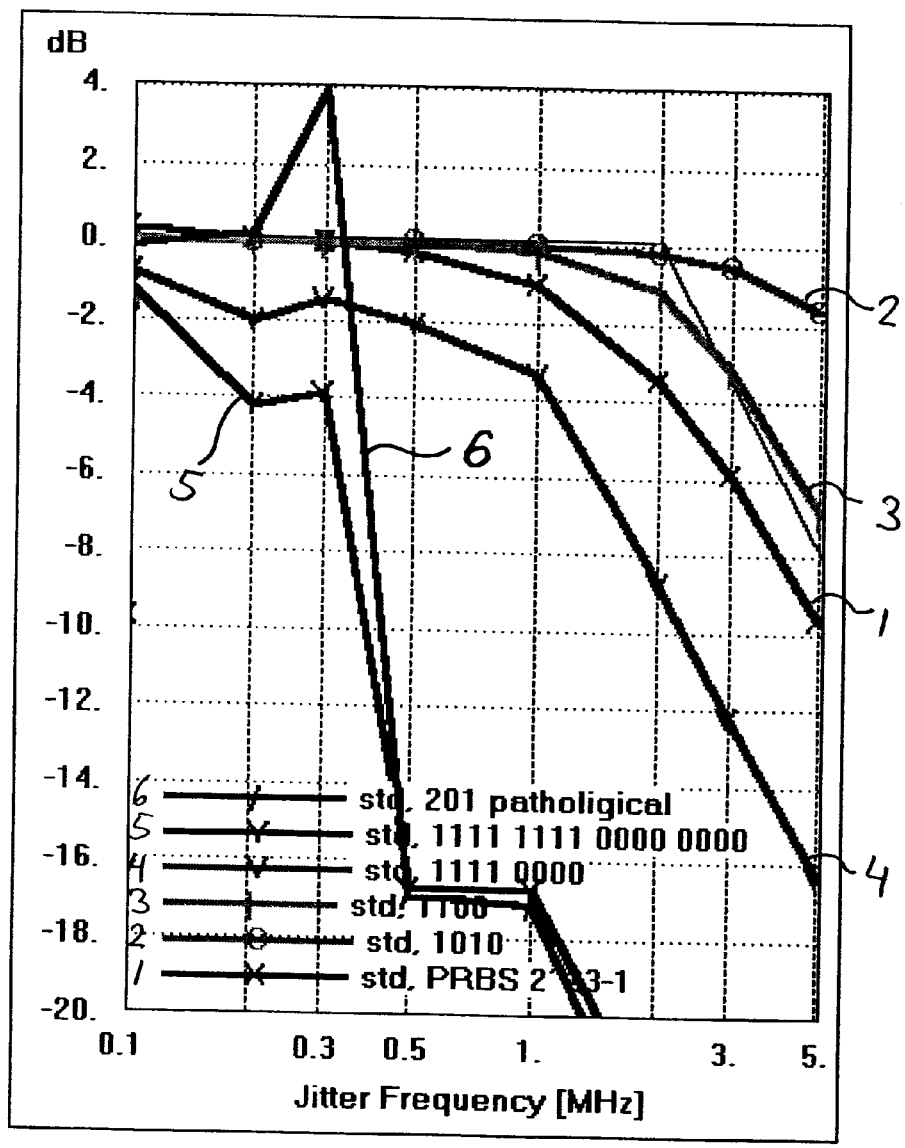
FIG. 3 shows a plot of jitter transfer of a clock and data recovery circuit with the phase detector shown in FIG. 1.

Likewise FIG. 3 shows a plot of measured jitter transfer of the same clock and data recovery circuit for the same data signals 1–6. Again the limits defined in the ITU-T recommendations G.825 and G.958 are plotted and it is seen that some of the curves exceed the recommended limits.

There are two important characteristics of jitter transfer: The jitter gain (or jitter peaking) that is defined as the largest ratio above 0 dB, and the jitter transfer bandwidth.

The measurements are performed at a signal to noise ratio 1 dB above the sensitivity threshold ($10\,e^{-9}$) according to the ITU recommendations.

Figure 4:
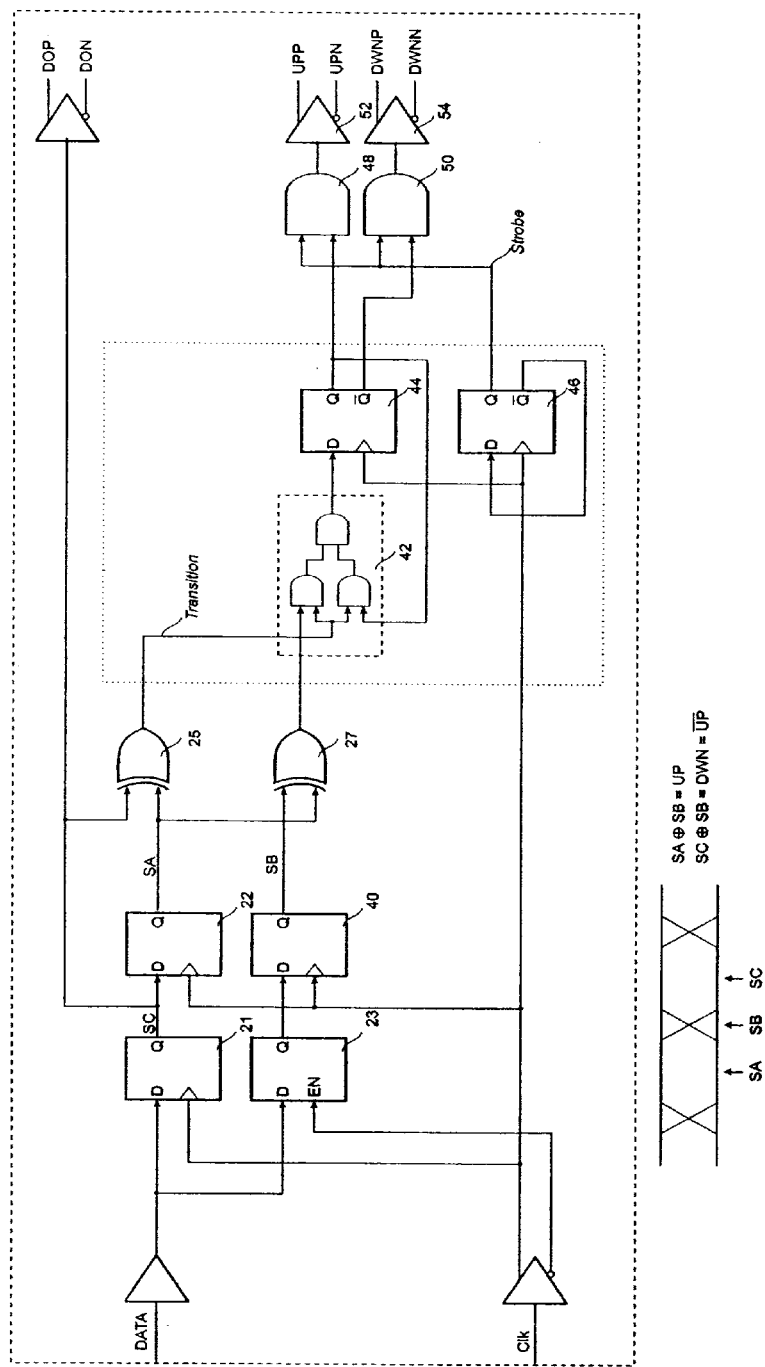
FIG. 4 shows an electronic circuit diagram of a bang bang phase detector according to the present invention.
Figure 5:
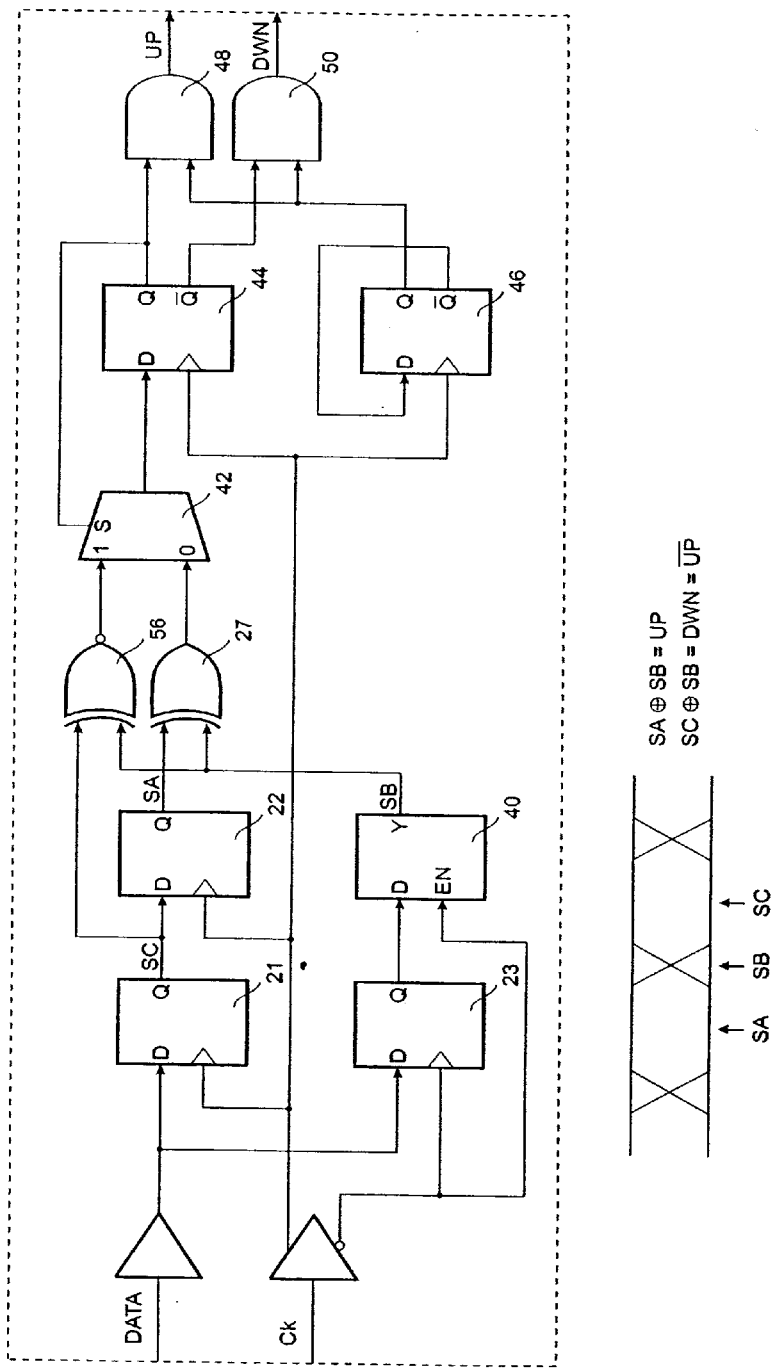
FIG. 5 shows an alternative embodiment of the present invention.

Phase detectors according to the present invention are shown schematically in FIGS. 4 and 5. In FIGS. 1, 4 and 5 corresponding circuit components are designated with identical reference numbers.

The operation of the phase detector of FIG. 4 will now be explained. The operation of circuit components 21–27 have already been explained with reference to FIG. 1. Circuit 42 is a data selector controlled by the output of ex-or gate 25, i.e. when a data bit transition has been detected, the output of ex-or gate 25 is logic "1" and the output of ex-or gate 27 is fed through the data selector 42 and provided to the input of flip-flop 44. If no data bit transition has been detected, the output of ex-or gate 25 is logic "0" and the output of flip-flop 44 is fed through the data selector 42 and provided to the input of flip-flop 44. Thus, if a data bit transition has been detected the output of ex-or gate 27 (up/down signal) is provided at the output of the flip-flop 44 at the next positive going clock edge, and if no data bit transition has been detected, the previous logic value of the up/down signal as stored in the flip-flop 44 is maintained as the output of the flip-flop 44.

Further, the flip-flop 46 generates a second clock signal with half the frequency of the input clock signal. The second clock signal is provided as a strobe input to AND gates 48, 50 whereby the outputs of the output line drivers 52, 54 are forced to logic "0" when the second clock signal is logic "0" and attains the value of the flip-flop 44 output and inverted output, respectively, when the second clock signal is logic "1".

During periods with no data bit transitions the output signal of flip-flop 44 is kept constant at the logic value of the latest detected data bit transition. This improves the dynamic response of a control loop incorporating the phase detector in that the dynamic response gets substantially independent of the transition density of the phase detector input signals.

Typically, the outputs of line drivers 52, 54 will have significant rise and fall times leading to generation of a varying output current over time if the outputs are kept constant for several clock cycles. The strobing of the output line drivers 52, 54 with the output of flipflop 46 suppresses this effect.

FIG. 5 shows an alternative embodiment of a phase detector according to the present invention. The operation of circuit components 21–27, 40, 46–50 have already been explained with reference to FIGS. 1 and 4. It is noted that the output of XOR gate 27 is high when a transition has occurred between sample A (SA) and sample B (SB). If the Q output of flip-flop 44 is zero, the selector 42 provides the output of XOR gate 27 as an input to the flip-flop 44. Thus, the zero output is maintained until a transition occurs between sample A (SA) and sample B (SB). Then the Q output of the flip-flop 44 changes to one on the next positive going edge of the clock and the selector 42 provides the output of EX-NOR gate 56 as an input to flip-flop 44. It is noted that the output of EX-NOR gate 56 remains high until a transition occurs between sample B (SB) and sample C (SC). Upon such a transition, the Q-output changes to zero on the next positive going edge of the clock and the selector 42 again provides the output of XOR gate 27 as an input to flip-flop 44. Thus, as for the phase detector of FIG. 4, the output signals of flip-flop 44 is kept constant at the logic value of the latest detected data bit transition during periods with no data bit transitions.

Figure 6:
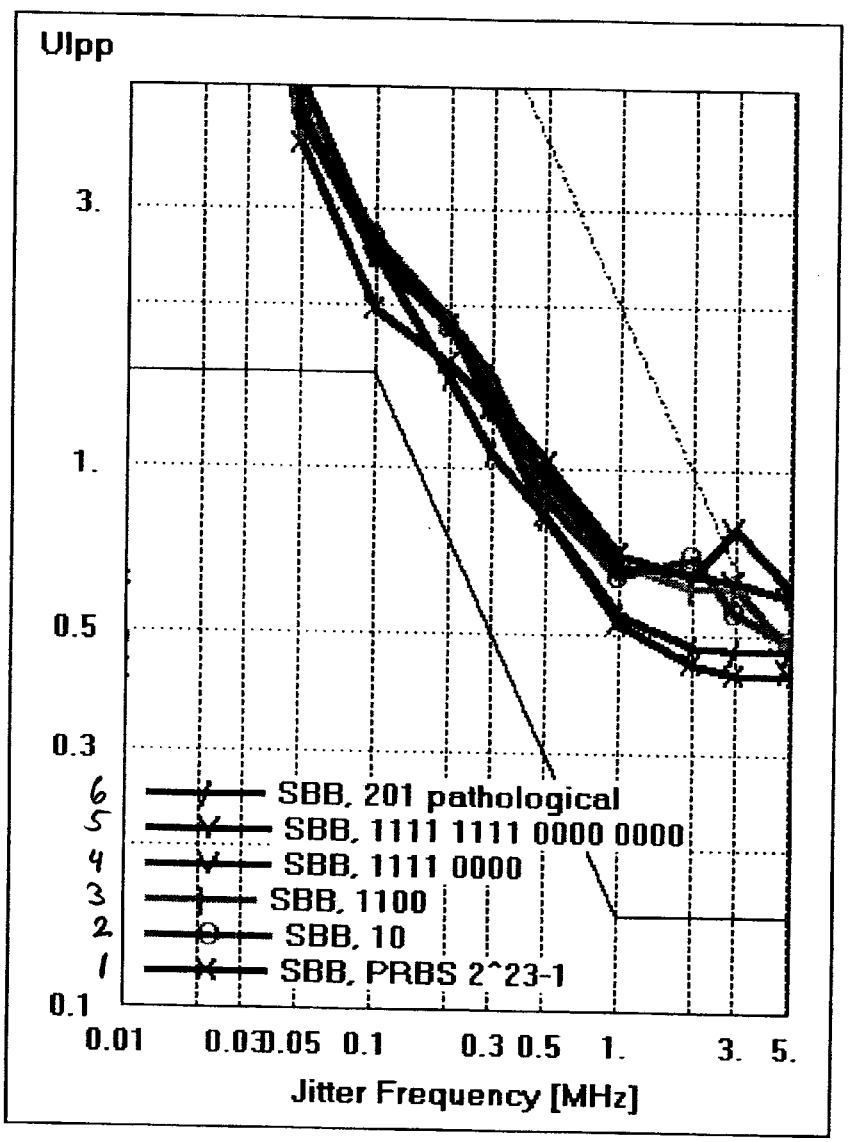
FIG. 6 shows a plot of jitter tolerance of a clock and data recovery circuit with the phase detector shown in FIG. 5.
Figure 7:
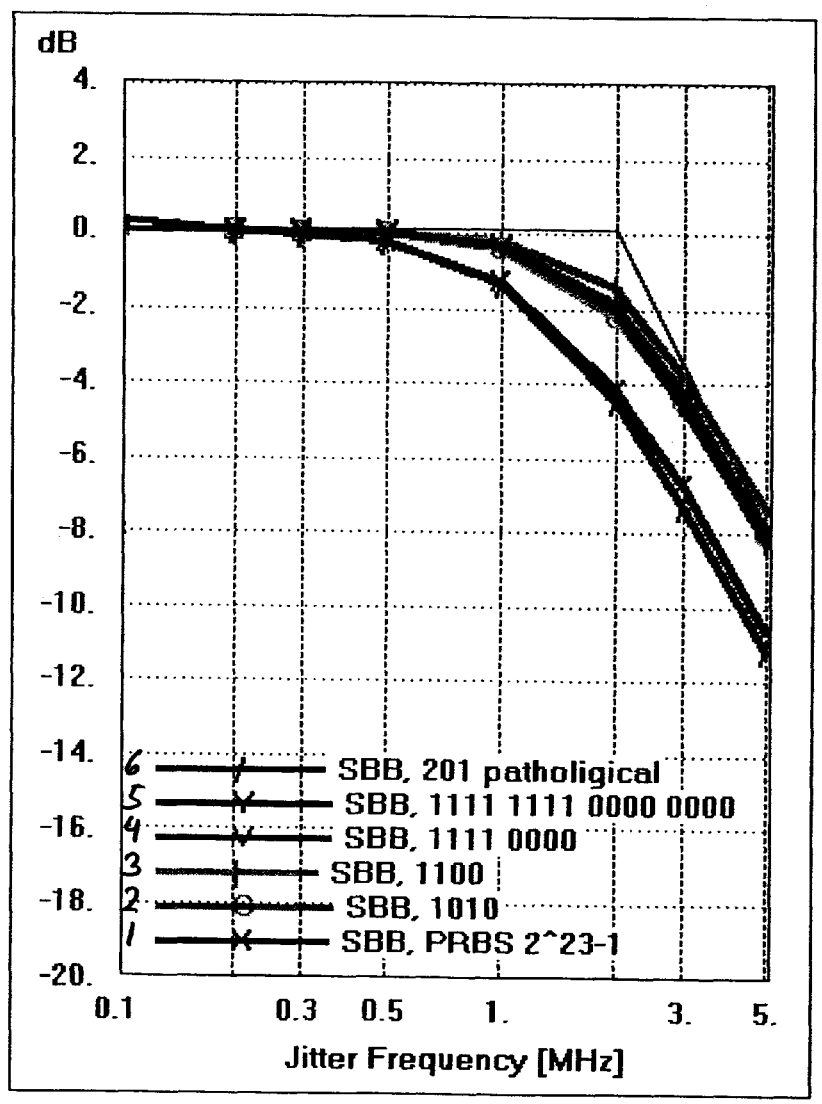
FIG. 7 shows a plot of jitter transfer of a clock and data recovery circuit with the phase detector shown in FIG. 5.

FIGS. 6 and 7 show plots of measured jitter tolerance and transfer, respectively, of a clock and data recovery circuit incorporating a phase detector of the type shown in FIG. 5. FIGS. 6 and 7 correspond to FIGS. 2 and 3, respectively. It is seen that the curves of FIGS. 6 and 7 lie well within the ranges recommended in the ITU-T recommendations.

Comparing FIGS. 2 and 3 with FIGS. 6 and 7 respectively, it is noted that jitter tolerance and transfer dependency on the specific bit pattern of the data signal has been significantly reduced in the circuit including a bang bang detector according to the present invention. It is also noted that jitter gain had been reduced.

Figure 8:
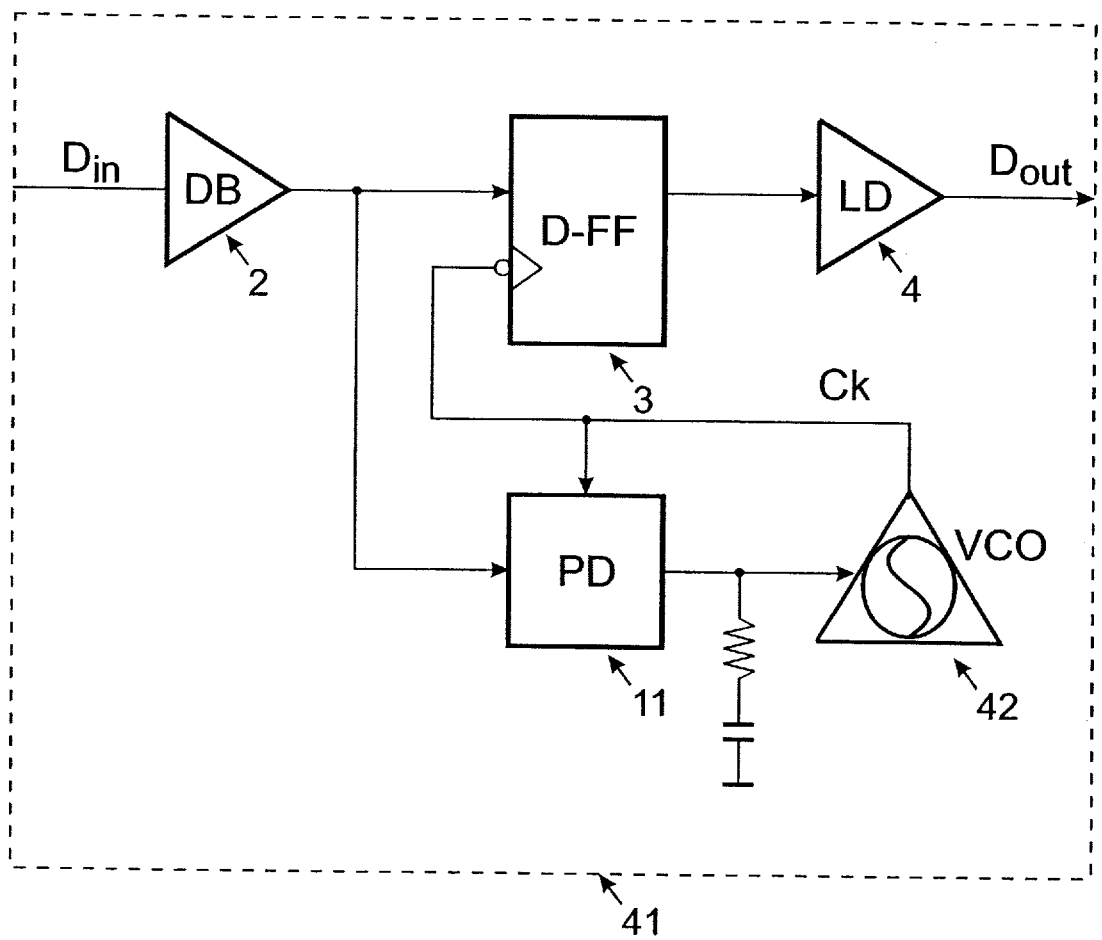
FIG. 8 shows an example of a clock and data recovery circuit with a phase detector according to the present invention.

FIG. 8 shows an example of a circuit with a phase detector according to the present invention. A data signal $D_{in}$ is fed through a data buffer 2 to a flip-flop 3 for synchronisation of the data signal $D_{in}$ with a clock signal ($C_k$). The synchronised data signal is then fed to a laser driver 4, the output signal of which $D_{out}$ is connected to a laser diode (not shown). The clock signal $C_k$ is generated by a voltage controlled oscillator VCO 42. The frequency of $C_k$ is controlled by the output signal from the phase detector 11, e.g. the phase detector shown in FIG. 4. In the VCO 42, a positive voltage from the detector 11 will reduce the frequency of $C_k$ whereas a negative voltage from the detector 11 will increase the frequency of $C_k$. Continuous adjustment of the clock signal $C_k$ is therefore obtained so that sampling in the flip-flop 3 is performed at the center of the bit period.

What is claimed is:

1. A method comprising:

detecting a transition of a first signal;

generating a logic output signal
   of a first logic value if a transition of a second signal occurs before the transition of the first signal and
   of a second logic value if the transition of the second signal occurs after the transition of the first signal;

maintaining the logic output signal at the generated value until detecting another transition of the first signal; and strobing the logic output signal with a strobe signal.

2. The method according to claim 1, further comprising generating the strobe signal from the second signal.

3. The method according to claim 1, further comprising sampling the first signal with the second signal.

4. A phase detector comprising:

a first logic circuit to detect a transition of a first signal;

a second logic circuit coupled to the first logic circuit to generate a logic output signal of a first logic value upon detecting a transition of the first signal if a transition of the second signal occurs before the transition of the first signal and of a second logic value if the transition of the second signal occurs after the transition of the first signal, and a third logic circuit coupled to the second logic circuit to maintain the logic output signal at the generated value until detecting another transition of the first signal.

5. The phase detector according to claim 4 further comprising a strobe signal to strobe the logic output signal.

6. The phase detector according to claim 5, wherein the second signal generates the strobe signal to strobe the logic output signal.

7. The phase detector according to claim 4, wherein the second signal is a clock signal to sample the first signal.

8. A circuit comprising:
   a controlled oscillator to generate a clock signal;
   a sampling circuit coupled to the clock signal of the controlled oscillator to sample a signal with the clock signal; and
   a phase locked loop including the controlled oscillator to phase lock the clock signal to the signal, and a phase detector wherein a strobed output of the phase detector adjusts the controlled oscillator to alter the frequency of the clock signal.

9. The circuit of claim 8 wherein the phase detector further comprises:
   a first logic circuit to detect a transition of the signal, and
   a second logic circuit coupled to the first logic circuit to generate a logic output signal of a first logic value upon detecting a transition of the signal if a transition of the clock signal occurs before the transition of the signal and of a second logic value if the transition of the clock signal occurs after the transition of the signal, and
   a third logic circuit coupled to the second logic circuit to maintain the logic output signal at the generated value until detecting another transition of the signal.

10. The circuit according to claim 9, wherein the clock signal generates a strobe signal to strobe the logic output signal.

* * * * *